United States Patent [19]

Toukhy

[11] Patent Number: 5,328,806
[45] Date of Patent: Jul. 12, 1994

[54] POSITIVE IMAGE FORMATION UTILIZING RADIATION SENSITIVE MIXTURE CONTAINING DIMERIC OR TRIMERIC SESAMOL/ALDEHYDE CONDENSATION PRODUCTS AS SENSITIVITY ENHANCERS

[75] Inventor: Medhat A. Toukhy, Barrington, R.I.

[73] Assignee: OCG Microelectronic Materials, Inc., West Paterson, N.J.

[21] Appl. No.: 134,448

[22] Filed: Oct. 12, 1993

Related U.S. Application Data

[62] Division of Ser. No. 11,565, Feb. 1, 1993, Pat. No. 5,275,911.

[51] Int. Cl.$^5$ .................... G03F 7/30; G03F 7/023
[52] U.S. Cl. .................... 430/296; 430/165; 430/191; 430/326; 430/331
[58] Field of Search ............... 430/191, 165, 326, 296, 430/331

[56] References Cited

U.S. PATENT DOCUMENTS 4,650,745  3/1987  Eilbeck .
4,738,915  4/1988  Komine et al. .

Primary Examiner—Charles L. Bowers, Jr.
Assistant Examiner—Christopher G. Young
Attorney, Agent, or Firm—William A. Simons

[57] ABSTRACT

A radiation-sensitive composition comprising an admixture in a solvent of: at least one alkali-soluble binder resin, at least one photoactive compound and an effective sensitivity enhancing amount of at least one dimeric or trimeric unit formed by the condensation reaction of an aldehyde with sesamol; the amount of said binder resin being about 60 to 95% by weight, the amount 40% of said photoactive component being about 5% to about by weight, based on the total solids content of said radiation-sensitive composition.

6 Claims, No Drawings

POSITIVE IMAGE FORMATION UTILIZING RADIATION SENSITIVE MIXTURE CONTAINING DIMERIC OR TRIMERIC SESAMOL/ALDEHYDE CONDENSATION PRODUCTS AS SENSITIVITY ENHANCERS

This application is a division of application Ser. No. 08/011,565, filed Feb. 1, 1993, U.S. Pat. No. 5,275,911 which is incorporated herein by reference in its entirety.

BACKGROUND OF THE INVENTION

1. Field Of the Invention

The present invention relates to radiation sensitive mixtures (e.g., those particularly useful as positive-working resist compositions) containing the admixture of an alkali-soluble binder resin, a photoactive compound and an effective sensitivity enhancing amount of at least one dimeric or trimeric unit formed by the condensation reaction of an aldehyde with sesamol all dissolved in a solvent. Furthermore, the present invention also relates to substrates coated with these radiation sensitive mixtures as well as the process of coating, imaging and developing these radiation sensitive mixtures on these substrates.

2. Brief Description Of Prior Art

Photoresist compositions are used in microlithographic processes for making miniaturized electronic components such as in the fabrication of integrated circuits and printed wiring board circuitry. In these processes, a thin coating or film of a photoresist composition is generally first applied to a substrate material, such as silicon wafers used for making integrated circuits or aluminum or copper plates of printed wiring boards. The preferred method of applying this film is spin coating. By this method, much of the solvent in the photoresist formulation is removed by the spinning operation. The coated substrate is then baked to evaporate any remaining solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam, ion beam, and X-ray radiant energy are radiation types commonly used today in microlithographic processes.

After this image-wise exposure, the coated substrate is treated with a developer solution to dissolve and remove either the radiation-exposed or the unexposed areas of the coated surface of the substrate. In some processes, it is desirable to bake the imaged resist coating before this developing step. This intermediate step is sometimes called post-exposure bake or PEB.

There are two types of photoresist compositions- negative-working and positive-working. When negative-working photoresist compositions are exposed image-wise to radiation, the areas of the resist composition exposed to the radiation become less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited but not exposed to the radiation. On the other hand, when positive-working photoresist compositions are exposed image-wise to radiation, those areas of the resist composition exposed to the radiation become more soluble to the developer solution (e.g., the Wolff rearrangement reaction of the photoactive compound occurs) while those areas not exposed remain relatively insoluble to the developer solution. Thus, treatment of an exposed positive-working resist with the developer solution causes removal of the exposed areas of the resist coating and the creation of a positive image in the photoresist coating. The desired portion of the underlying substrate surface is uncovered where the photoresist was exposed to the radiation.

Positive-working photoresist compositions are currently favored over negative-working resists because the former generally have better resolution capabilities and pattern transfer characteristics.

After this development operation, the now partially unprotected substrate may be treated with a substrate-etchant solution or plasma gases and the like. This etchant solution or plasma gases etch the portion of the substrate where the photoresist coating was removed during development. The areas of the substrate are protected where the photoresist coating still remains and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

End users of photoresists are demanding photoresist formulations possess better lithographic properties for the fabrication of smaller microelectronic circuits. The lithographic properties which are critical to positive-working photoresist end-users include the following: (1) good resolution capabilities in both the micron and submicron ranges without incomplete development in the exposed areas (i.e., scumming); (2) higher thermal image deformation temperatures (e.g., above 120° C.); (3) relatively fast photospeeds; (4) good adhesion to substrate; (5) good development contrast; (6) good process latitude; (7) near to absolute vertical profiles (or good contrast) between exposed and unexposed photoresist areas after development; (8) good resistance to etching solutions and plasma etching techniques; (9) reduced tendency to form insoluble particulates; and (10) mask linearity.

Generally in the past, efforts to improve one of these lithographic properties have caused significant decreases in one or more of the other lithographic properties of the photoresist. Accordingly, there is a need for improved photoresist formulations which possess all of these desired properties without making significant tradeoffs. The present invention is believed to be an answer to that need.

For example, it is well known to add sensitivity enhancers (also known as photospeed enhancers or speed enhancers or dissolution enhancers) to resist formulation to increase the solubility of the resist coating in both the exposed and unexposed areas when the speed of development is an overriding processing consideration. However, some degree of contrast may be sacrificed with the addition of such sensitivity enhancers, (e.g., in positive-working resists, while the exposed areas of the resist coating will be more quickly developed, the sensitivity enhancers will also cause a larger loss of the resist coating from the unexposed areas). Thus, if too much resist coating is removed from the unexposed areas of a positive-working resins, film defects such as pinholes may be introduced into the coating or subsequent plasma etching steps may cause unwanted breakthroughs in the unexposed areas. Accordingly, sensitivity enhancers should provide the desired increased speed of development without too much more film loss in the unexposed areas.

Numerous compounds have been proposed as sensitivity enhancers in resist compounds. See U.S. Pat. Nos. 3,661,582; 4,009,033; 4,036,644; 4,115,128; 4,275,139; 4,365,019; 4,650,745; and 4,738,915 for examples of known sensitivity enhancers. All of these U.S. Patents are incorporated herein by reference in their entities. While their known sensitivity enhancers may be suitable for some resist formulation or for some particular end uses, there is a need for new sensitivity enhancers which have better sensitivity enhancement without significant film loss in other resist formulations or in other end uses, or are suitable in a certain combination of resist formulations or a combination of end uses to which the previously known sensitivity enhancers are not suitable. The present invention is believed to be an answer to this need.

Separately, sesamol ($C_7H_6O_3$) or 3,4-methylenedioxyphenol is a known phenolic hydrolysis product of sesamolin. Sesamol has a chemical formula of:

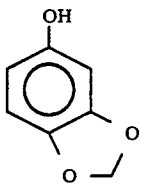

The reaction of sesamol as a phenolic monomer for reactions with aldehydes to prepare phenolic dimers, trimers, oligomers, or novolaks has not been reported in the literature.

BRIEF SUMMARY OF THE INVENTION

Accordingly, the present invention is directed to a radiation sensitive composition useful as a positive-working resist comprising an admixture in a solvent of:
(a) at least one photoactive compound;
(b) at least one alkali-soluble binder resin; and
(c) an effective sensitivity enhancing amount of at least one dimeric or trimeric unit formed by the condensation reaction of an aldehyde with sesamol; the amount of said photoactive compound or compounds being about 5% to about 40% by weight and the amount of said binder resin or resins being about 60 to 95% by weight, based on the total solids content of said radiation sensitive mixture.

Furthermore, the present invention also encompasses the process of coating substrates with these radiation sensitive mixtures and their exposing and developing these coated substrates.

Also further, the present invention encompasses said coated substrates (both before and after imaging) as novel articles of manufacture.

DETAILED DESCRIPTION

As mentioned above, the radiation-sensitive compositions of the present invention have three critical ingredients; at least one alkali-soluble binder resin; at least one photoactive compound; and at least one dimeric or trimeric unit formed by the condensation reaction of an aldehyde and sesamol.

Any or all binder resins commonly employed in photoresist compositions may be used herein. The preferred class of binder resins is alkali-soluble resin or resins which are useful in positive-working photoresist compositions. The term "alkali-soluble binder resin" is used herein to mean a resin which will dissolve completely in an aqueous alkaline developing solution conventionally used with positive-working photoresist compositions. Suitable alkali-soluble resins include phenolic novolaks such as phenolformaldehyde novolak resins, cresol-formaldehyde novolak resins, or polyvinyl phenol resins, preferably those having an average weight molecular weight (Mw) of about 500 to about 40,000, and more preferably from about 800 to 20,000. The novolak resins are preferably prepared by the condensation reaction of phenol or cresols with formaldehyde and are characterized by being light-table, water-insoluble, alkali-soluble, and film-forming. The most preferred class of novolak resins is formed by the condensation reaction between a mixture of meta- and para-cresols with formaldehyde.

Any and all photoactive compounds which make radiation-sensitive mixtures useful as photoresists may be employed herein. Such classes of photoactive compounds include bis-azides and o-quinonediazides. The preferred class of photoactive compounds (sometimes called "sensitizers") is o-quinonediazide compounds, particularly esters derived from polyhydric phenols, alkyl-polyhydroxyphenones, aryl-polyhydroxyphenones, and the like which can contain up to six or more sites for esterification. The most preferred o-quinonediazide esters are derived from 3-diazo-3,4-dihydro-4-oxonaphthalene-1-sulfonic acid chloride (also know as 1,2-naphthoquinonediazide-4-sulfonyl chloride) and 6-diazo-5,6-dihydro-5-oxo-naphthalene-l-sulfonic acid chloride (also known as 1,2-naphthoquinonediazide-5-sulfonyl chloride).

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenylalkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-4-sulfonic acid esters, 2,4-dihydroxybenzophenone 1,2-naphthoquinonediazide-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide-4-sulfonic acid esters, 2,4,6-trihydroxybenzophenone 1,2-naphthoquinone-diazide-5-sulfonic acid esters, 2,2',4,4'-tetrahydroxy-benzophenone 1,2-naphthoquinonediazide-5-sulfonic acid esters, 2,3,4,4'-tetrahydroxy-benzophenone, 1,2-naphthoquinonediazide-5-sulfonic acid esters, 2,3,4,4'-tetrahydroxybenzophenone 1,2-naphthoquinone-diazide-4-sulfonic acid esters, 2,2',3,4',6'-pentahydroxybenzophenone 1,2-naphthoquinone-diazide-5-sulfonic acid esters, and 2,3,3',4,4',5'-hexahydroxy-benzophenone 1,2-naphthoquinonediazide-5-sulfonic acid esters; 1,2-quinonediazidesulfonic acid esters of bis[(poly)-hydroxyphenyl]alkanes such as bis(p-hydroxyphenyl)-methane 1,2-naphthoquinonediazide-4-sulfonic acid esters, bis(2,4-dihydroxyphenyl)methane 1,2-naphthoquinonediazide-5-sulfonic acid esters, bis(2,3,4-trihydroxyphenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters and 2,2-bis(2,3,4-trihydroxyphenyl)propane 1,2-naphthoquinonediazide-5-sulfonic acid esters. Besides the 1,2-quinonediazide compounds exemplified 'above, there can also be used the 1,2-quinonediazide compounds described in J. Kosar, "Light-Sensitive Systems", 339-352 (1965), John Wiley & Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, arylpolyhydroxyphenone and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta-, and hexa-esters of polyhydroxy compounds having at least 2 hydroxyl groups, i.e., about 2 to 6 hydroxyl groups, are one class of preferred compounds.

Among this class of preferred 1,2-naphthoquinonediazide compounds are 2,3,4-trihydroxybenzophenone 1,2-naphthoquinone-diazide-5-sulfonic acid esters, 2,3,4,4'-tetrahydroxy-benzophenone 1,2-naphthoquinonediazide-5-sulfonic acid esters, and 2,2',4,4'-tetra-hydroxybenzo-phenone 1,2-naphthoquinonediazide-5-sulfonic acid esters. Another preferred 1,2-quinonediazide compound is mixed 1,2-naphthoquinonediazide-5-sulfonic acid esters of 2,2'3,3'-tetrahydro-3,3,3',3'-tetramethyl-1,1-spirobi (1H-indene)-5,5'6,6'7,7'-hexol (C.A.S. Reg. No. 32737-33-0). These 1,2-naphthoquinonediazide compounds may be used alone or in combination of two or more.

Another preferred 1,2-naphthoquinone-5-diazide compounds are phenol 1,2-naphthoquinonediazide-5-sulfonic acid ester and bis[4-(2,6-dimethylphenol)]-4-catehol methane 1,2-naphthoquinone-5-diazide sulfonic acid esters.

Another preferred class of photoactive o-quinonediazide compounds is prepared by condensing spirobiindane or spirobichroman derivatives with 1,2-naphthoquinonediazido-4-sulfonyl chloride or 1,2-naphthoquinonediazide-5-sulfonyl chloride or a mixture thereof to make compounds of formula (A) shown below:

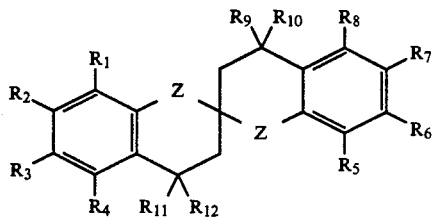
(A)

wherein $R_1$ to $R_8$ are independently hydrogen, a hydroxyl group, a halogen atom, an alkyl group, an alkoxy group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, nitro group, an acyl group, an alkyloxycarbonyl group, an aryloxycarbonyl group, an acyloxy group,

(wherein R is hydrogen, or an alkyl group, and D is a 1,2-naphthoquinonediazido-5-sulfonyl group or a 1,2-naphthoquinonediazido-4-sulfonyl group); $R_9$ to $R_{12}$ are independently hydrogen or a lower alkyl group; and Z is oxygen or a single bond (i.e. the latter forms a five-member ring); provided that at least one of $R_1$ to $R_8$ is

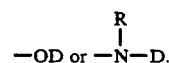

The halogen represented by $R_1$ to $R_8$ in the formula (A) is preferably chlorine, bromine or iodine.

The alkyl group is preferably an alkyl group having 1 to 4 carbon atoms, such as methyl, ethyl, propyl, isopropyl, n-butyl, isobutyl, sec-butyl and tert-butyl.

The alkoxy group is preferably an alkoxy group having 1 to 4 carbon atoms, such as methoxy, ethoxy, hydroxyethoxy, propoxy, hydroxypropoxy, isopropoxy, n-butoxy, isobutoxy, sec-butoxy and tert-butoxy.

The aralkyl group is preferably a benzyl group, a phenethyl group or a benzhydryl group.

The aryl group is preferably phenyl, tolyl, hydroxyphenyl or naphthyl.

The monoalkylamino group is preferably a monoalkylamino group having 1 to 4 carbon atoms, such as monomethylamino, monoethylamino, monopropylamino, monoisopropylamino, mono-n-butylamino, monoisobutylamino, mono-sec-butylamino, or mono-tert-butylamino.

The dialkylamino group is preferably a dialkylamino group with each akyl substituent having 1 to 4 carbon atoms, such as dimethylamino, diethylamino, dipropylamino, di-isopropylamino, di-n-butylamino, di-iso-butylamino, di-sec-butylamino, or di-tert-butylamino.

The acylamino group is preferably an aliphatic group-substituted acylamino group such as acetylamino, propionylamino, butylamino, isobutylamino, isovalerylamino, pivaloylamino or valerylamino, or an aromatic group-substituted acylamino group such as benzoylamino or toluoylamino.

The alkylcarbamoyl group is preferably an alkylcarbamoyl group having 2 to 5 carbon atoms, such as methylcarbamoyl, ethylcarbamoyl, propylcarbamoyl, isopropylcarbamoyl, n-butylcarbamoyl, isobutylcarbamoyl, sec-butylcarbamoyl, or tert-butylcarbamoyl.

The arylcarbamoyl group is preferably phenylcarbamoyl or tolylcarbamoyl.

The alkylsulfamoyl group is preferably an alkylsulfamoyl group having 1 to 4 carbon atoms, such as methylsulfamoyl, ethylsulfamoyl, propylsulfamoyl, isopropylsulfamoyl, n-butylsulfamoyl, secbutylsulfamoyl, or tert-butylsulfamoyl.

The arylsulfamoyl group is preferably phenylsulfamoyl or tolylsulfamoyl.

The acyl group is preferably an aliphatic acyl group having 1 to 5 carbon atoms, such as formyl, acetyl, propionyl, butyryl, isobutyryl, valeryl, isovaleryl or pivaloyl, or an aromatic acyl group, such as benzoyl, toluoyl, salicyloyl, or naphthoyl.

The alkyloxycarbonyl group is preferably an alkyloxycarbonyl group having 2 to 5 carbon atoms, such as methoxycarbonyl, ethoxycarbonyl, propoxycarbonyl, isopropoxycarbonyl, n-butoxycarbonyl, isobutoxycarbonyl, sec-butoxycarbonyl, or tert-butoxycarbonyl.

The aryloxycarbonyl group is preferably phenoxycarbonyl.

The acyloxy group is preferably an aliphatic acyloxy group having 2 to 5 carbon atoms, such as acetoxy, propionyloxy, butyryloxy, isobutyryloxy, valeryloxy, isovaleryloxy or pivaloyloxy, or an aromatic acyloxy group such as benzoyloxy, toluoyloxy, or naphthoyloxy.

The lower alkyl group represented by $R_9$ to $R_{12}$ in the formula (A) is preferably an alkyl group having 1 to 4 carbon atoms, such as methyl, ethyl, propyl, isopropyl, butyl, isobutyl, sec-butyl, or tert-butyl.

In the formula (A) above, $R_1$ to $R_8$ are preferably a hydrogen atom, a hydroxy group or an —OD group wherein D is as defined above, and $R_9$ to $R_{12}$ are preferably a hydrogen atom or a methyl group. R is preferably an alkyl group having 1 to 4 carbon atoms, such as a methyl, ethyl, n-propyl, isopropyl, n-butyl, isobutyl, sec-butyl, or t-butyl group.

The proportion of the photoactive compound in the radiation-sensitive mixture may range from about 5% to about 40%, more preferably from about 10% to about 25% by weight of the nonvolatile (e.g., nonsolvent) content of the radiation-sensitive mixture. The proportion of total binder resin of this present invention in the radiation-sensitive mixture may range from about 60% to about 95%, preferably, from about 75% to 90% by weight, of the nonvolatile (e.g., excluding solvents) content of the radiation-sensitive mixture.

The third critical ingredient of the radiation-sensitive composition of the present invention is at least one dimeric or trimeric unit formed by the condensation reaction of an aldehyde and sesamol. Examples of these dimeric or trimeric units include the following:

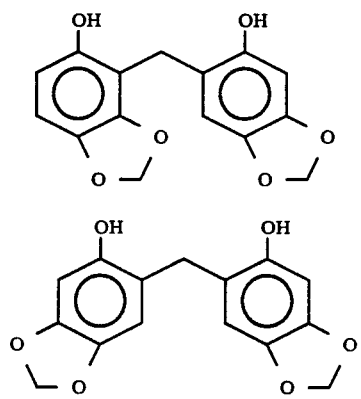

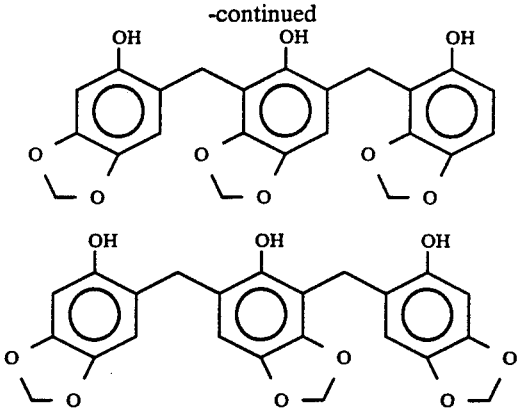

This condensation reaction is preferably carried out by reacting sesamol and an aldehyde in a suitable mole ratio in the presence of an acid catalyst. The mole ratio is sesamol to aldehyde in preferably about 1:1 to about 0.98:1; more preferably, about 0,995:1 to about 0.985:1. Suitable acid catalysts include oxalic acid and the like. The preferred reaction temperatures for this condensation reaction are 95°–100° C.; more preferably, 96°–98° C. The preferable reaction times for this condensation reaction are 12–18 hours. The preferred reaction pressure is atmospheric pressure. Suitable aldehyde precursors for this condensation reaction include formaldehyde, although any other conventional aldehyde source could be employed.

The preferred proportion of the these dimeric or trimeric units in the radiation-sensitive mixture may range from about 0.5% to about 20%, preferably about 2% to 15%, by weight of the nonvolatile (e.g., excluding solvents) content of the radiation-sensitive mixture.

These radiation-sensitive mixtures may also contain, besides the resin, photoactive compound and dimeric or trimeric units of the condensation reaction of an aldehyde with sesamol, conventional photoresist composition ingredients such as other resins, solvents, actinic and contrast dyes, anti-striation agents, plasticizers, other sensitivity enhancers, and the like. These additional ingredients may be added to the binder resin, photoactive compound and dimeric or trimeric solution before the solution is coated onto the substrate.

The binder resin, photoactive compound or sensitizer, and dimeric or trimeric units of sesamol and aldehydes may be dissolved in a solvent or solvents to facilitate their application to the substrate. Examples of suitable solvents include methoxyacetoxy propane, diglyme, toluene, ethyl cellosolve acetate, n-butyl acetate, ethyl lactate, propylene glycol alkyl ether acetates, methyl .3-methoxy propionate, or mixtures thereof and the like. Cosolvents such as xylene, n-butylacetate, or ethyl 3-ethoxy propionate or the like may also be used. The most preferred solvent is ethyl lactate alone or in combination with another solvent (e.g., ethyl 3-ethoxy propionate). The preferred amount of solvent may be from about 50% to about 500%, or higher, by weight, more preferably, from about 100% to about 400% by weight, based on combined resin, sensitizer, and dimeric or trimeric unit of sesamol/aldehyde weight.

Actinic dyes help provide increased resolution on highly reflective surfaces by inhibiting back scattering of light off the substrate. This back scattering causes the undesirable effect of optical notching, especially on a substrate topography. Examples of actinic dyes include those that absorb light energy at approximately 400–460 nm [e.g., Fat Brown B (C.I. No. 12010); Fat Brown RR (C.I. No. 11285); 2-hydroxy-1,4-naphthoquinone (C.I. No. 75480) and Quinoline Yellow A (C.I. No. 47000) and Macrolex Fluoroyellow 10GN (C. I. No. Solvent Yellow 16:1)] and those that absorb light energy at approximately 300–340 nm [e.g. 2,5-diphenyloxazole (PPO-Chem. Abs. Reg. No. 92-71-7) and 2-(4-biphenyl)-6-phenyl-benzoxazole (PBBO-Chem. Abs. Reg. No. 17064-47-0)]. The amount of actinic dyes may be up to 10% weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. No. 42514), Oil Blue N (C.I. No. 61555) and Calco Red A (C.I. No. 26125) up to 10% weight levels, based on the combined weight of resin and sensitizer. Other suitable contrast dyes include F-8 Dye and BLANKOPHOR FBW (also known as Fluorescent Brightner 121).

Anti-striation agents or leveling agents level out the resist coating or film to a uniform thickness. In other words, the leveling agent is used to eliminate the formation of striations on the surface of the resist coating once the coating is spun onto the substrate surface. Anti-striation agents may be used up to 5% weight levels, based on the weight of solids in the resist formulation. One suitable class of antistriation agents is nonionic silicon-modified polymers. A preferred one is TROYKYD 366 made by Troy Chemical Co., Newark, N.J. Another suitable class of antistriation agents is fluoroaliphatic polymeric ester surfactants. A preferred one is FC-430 FLUORAD made by 3M of St. Paul, Minn. Nonionic surfactants may also be used for this purpose, including, for example, nonylphenoxy poly(ethyleneoxy) ethanol; octylphenoxy (ethyleneoxy) ethanol; dinonyl phenoxy poly(ethyleneoxy) ethanol, polyoxyethylene lauryl ether, polyoxyethylene oleyl ether, polyoxyethylene octylphenyl ether, polyoxyethylene nonylphenyl ether, polyoxyethylene glycol dilaurate, and polyoxyethylene glycol distearate. Also may be useful are organosiloxane polymers and acrylic acid containing or methacrylate acid-containing polymers.

The photoresist coatings produced by the above described procedure are particularly suitable for application to silicon/silicon dioxide-coated or polysilicon or silicon nitride wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate may be preferably soft baked at approximately 70° to 125° C. until substantially all the solvent has evaporated and only a uniform radiation-sensitive coating remains on the substrate.

The coated substrate can then be exposed to radiation, in any desired exposure pattern, produced by use of suitable masks, negatives, stencils, templates, and the like. Conventional imaging process or apparatus currently used in processing photoresist-coated substrates may be employed with the present invention. While ultraviolet (UV) light and electron beam radiations are the preferred sources of radiation, other sources such as visible light, ion beam, and X-ray radiant energy may be instead used. In some instances, a post-exposure bake at a temperature about 10° C. higher than the soft bake temperature for about 30–300 seconds is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coating's thermal deformation temperature.

In the manufacture of microcircuitry units, the developed substrates may then be treated with a plasma gas etch employing conventional plasma processing parameters (e.g., pressure and gas flow rates) and conventional plasma equipment.

Later, the remaining areas of the photoresist coating may be removed from the etched substrate surface by conventional photoresist stripping operations.

The present invention is further described in detail by means of the following Examples. All parts and percentages are by weight unless explicitly stated otherwise.

EXAMPLE 1

Speed Enhancer Synthesis 75 grams (0,543 moles) of sesamol was weighed in a 500 ml. flask. 44.8 grams (0.55 moles) of formaldehyde solution at 37% by weight concentration in water was added to the flask. Oxalic acid dihydrate catalyst (1.0 gram) was added to the reaction mixture. The reaction mixture was then diluted with 200 grams of water. The reaction flask was equipped with stirring, condenser, thermometer, and electric heating capability. The reaction mixture was heated at reflux temperature (95° C.) for 12 hours. Initially, the sesamol and the oxalic acid dissolved completely in water but as soon as the temperature of the reaction reached reflux, a water insoluble product started to form and precipitate out of the reaction solution. At the end of the reaction, this insoluble product was filtered out of solution, washed with deionized water, and dried in vacuum oven at 60° C. about 16 hours.

About 80 grams of dry product was collected and analyzed by HPLC (high pressure liquid chromatography) and NMR (nuclear magnetic resonance). The analysis suggested that the product was a mixture of about 80% dimer and approximately 20% trimer formed by the condensation reaction of sesamol and formaldehyde. The yield of this reaction, based on the molecular structure of the mixed product, was about 96%.

EXAMPLE 2

Resist Formulation, with Speed Enhancer, 19% PAC 13.25 grams of STN novolak [having a dissolution time of 300 second/micron in 0.262N aqueous developer of tetramethylammoniumhydroxide (TMAH)] was dissolved in a solvent mixture of 37.25 grams of ethyl lactate and 15.96 grams of ethyl 3-ethylpropionate. 2.71 grams of the product prepared as in Example 1 was added to the novolak solution. A mixture of photoactive compounds (PAC's) consisting of 1.68 grams of 3-TPM PAC and 2.15 grams of 4-TPM PAC was dissolved in the resist solution. Additionally, 0.036 grams of a f-8 dye and 70 microliters of Troykyd leveling agent were added to this solution. The resist solution was microfiltered through 0.2 micron pore size filter.

The STN novolak was prepared by condensing a mixture of substituted phenols with formaldehyde according to general procedure set forth in U.S. patent application Ser. No. 07/713,891 filed by Charles E. Ebersole on Jun. 19, 1991. The phenolic composition of this novolak is 20% p-cresol (as dimers), 50% 2,3-dimethylphenol, 20% 2,3,5-trimethylphenol, 8% 2,6-dimethylphenol, and 2% o-cresol. The 3-TPM PAC is the product of esterifying about 2.6 moles of 2,1-diazonaphthoquinone; 5-sulfonyl chloride (DNQ) with one mole of bis-[3,5-dimethyl-4-hydroxyphenyl]3-methoxy-4-hydroxyphenyl methane. The 4-TPM PAC is the product of esterifying about 2.3 moles of DNQ with one mole of bis-[3,5-dimethyl-4-hydroxyphenyl]-3,4-dihydroxyphenyl methane. The F-8 dye is 2-hydroxy-4-dibutylamine-2'-carboxybenzophenone. The Troykyd 366 leveling agent is a nonionic silicon-modified polymer.

COMPARISON 1

Comparative Resist Formulation Without Speed Enhancer, 22,4% Photoactive Compounds 13.25 grams of the same STN novolak used in Example 1 was dissolved in a solvent mixture of 37.25 grams of ethyl lactate and 15.96 grams of ethyl 3-ethoxypropionate. A mixture of photoactive compounds (PAC's) consisting of 1.68 grams of the 3-TPM PAC and 2.15 grams of the 4-TPM PAC was then dissolved in the novolak solution. Additionally, 0.036 grams of F-8 dye and 70 microliters of Troykyd 366 leveling agent were added to this solution. The resulting resist solution was microfiltered through 0.2 micron pore size filter.

COMPARISON 2

Comparative Resist Formulation Without Speed Enhancer, 19% Photoactive Compounds 13.25 grams of the same STN novolak used in Example 1 was dissolved in a solvent mixture of 30.94 grams of ethyl lactate and 13.26 grams of ethyl 3-ethoxypropionate. A mixture of photoactive compounds consisting of 0.93 grams of the 3-TPM PAC and 2.17 grams of the 4-TPM PAC were dissolved in the resist solution. Additionally, 0.036 grams of F-8 dye and 70 microliters of Troykyd 366 leveling agent were added to this solution. The resist solution was microfiltered through 0.2 micron pore size filter.

RESIST PROCESSING: Resist coatings from Example 2 and Comparisons 1 and 2 were prepared by spin coating on 100 millimeter diameter silicon wafers and soft baked at 90° C. for one minute. Coated wafers were exposed to patterned ultra violet radiation at 365 nm using a step and repeat GCA 0.45NA exposure unit. Exposed waters were then baked for one minute at 120° C. and developed in puddle mode for one minute using an aqueous alkaline solution of 0.262N TMAH.

RESULTS: The relative resist photospeeds (Eo) for the resist prepared according to Example 2 was 80 $mj/cm^2$ for the resist thickness of 1.1864 nm compared with 175 $mJ/cm^2$ for the resist prepared according to Comparison 1 and about 140 $mJ/cm^2$ for the resist prepared according to Comparison 2, both at 1.187 micron thickness.

Eo is defined here as the minimum exposure dose required to completely dissolve the resist film in large unpatterned areas (greater than 10 microns).

The optimum exposure energy for the resist of Example 2 is 130 $mJ/cm^2$ at 1.2183 micron of resist thickness and 150 $mJ/cm^2$ at 1.1881 micron resist thickness to reproduce the test pattern of equal 0.5 micron lines and spaces. The resolution of this resist using 0.45NA i-line stepper is 0.42 micron. The resist maintained equal lines and spaces of 0.5 micron $\pm 10\%$ over a range of at least 1.8 micron of defocus.

In contrast, the optimum exposure energies of the resists of Comparisons 1 and 2 were equal to or greater than 350 and 280 $mJ/Cm^2$ respectively at 1.187 micron resist film thickness. No resolution or latitude data were obtained for these resist due to their slow photospeeds.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. The process of developing an image-wise exposed photoresist-coated substrate comprising:
   (a) coating said substrate with a radiation-sensitive composition useful as a photoresist, said composition comprising an admixture in a solvent of: at least one alkali-soluble binder resin, at least one photoactive compound and an effective sensitivity enhancing amount of at least one dimeric or trimeric unit formed by the condensation reaction of an aldehyde with sesamol; the amount of said binder resin being about 60 to 95% by weight, the amount of said photoactive component being about 5% to about 40% by weight, based on the total solids content of said radiation-sensitive composition;
   (b) subjecting said coating on said substrate to an image-wise exposure of radiant light energy; and (c) subjecting said image-wise exposed coated substrate to a developing solution to remove the image-wise exposed areas and form a positive image-wise pattern in the coating.

2. The process of claim 1 wherein said binder resin is an alkali-soluble phenolic novolak resin.

3. The process of claim 1 wherein said at least one photoactive compound is an o-quinonediazide compound.

4. The process of claim 1 wherein said dimeric or trimeric units are present in the amount from about 2% to about 15% by weight, based on the total solids content of said radiation-sensitive composition.

5. The process of claim 1 wherein said radiant light energy is selected from the group consisting of ultraviolet light radiation and electron beam radiation.

6. The process of claim 1 wherein said developing solution is an aqueous solution of an alkali selected from the group consisting of tetramethylammonium hydroxide, sodium hydroxide, potassium hydroxide, ethanolamine, chlorine, sodium phosphates, sodium carbonate, and sodium metasilicates.

* * * * *